(12) United States Patent
Chang et al.

(10) Patent No.: US 7,215,547 B2
(45) Date of Patent: May 8, 2007

(54) INTEGRATED COOLING SYSTEM FOR ELECTRONIC DEVICES

(75) Inventors: Shih-Chia Chang, Bloomfield Hills, MI (US); Bruce A. Myers, Kokomo, IN (US); Darrel E. Peugh, Kokomo, IN (US); Carl W. Berlin, West Lafayette, IN (US); M. Ray Fairchild, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 348 days.

(21) Appl. No.: 10/919,168

(22) Filed: Aug. 16, 2004

(65) Prior Publication Data
US 2006/0034052 A1 Feb. 16, 2006

(51) Int. Cl.
*H05K 7/20* (2006.01)
(52) U.S. Cl. ............ 361/701; 361/699; 361/702; 361/719; 165/80.4; 165/80.5; 165/104.33; 174/15.1; 174/252
(58) Field of Classification Search ........ 361/699–703, 361/719; 257/713–715; 165/80.4, 104.33, 165/80.5, 121, 165; 174/15.1, 252, 16.1
See application file for complete search history.

(56) References Cited

U.S. PATENT DOCUMENTS

| 5,763,951 | A | * | 6/1998 | Hamilton et al. ........... 257/714 |
| 5,870,823 | A | * | 2/1999 | Bezama et al. ............... 29/848 |
| 5,901,037 | A | * | 5/1999 | Hamilton et al. .......... 361/699 |
| 6,377,457 | B1 | * | 4/2002 | Seshan et al. .............. 361/690 |
| 6,437,437 | B1 | | 8/2002 | Zuo et al. |
| 6,490,159 | B1 | * | 12/2002 | Goenka et al. ............. 361/700 |
| 6,529,377 | B1 | * | 3/2003 | Nelson et al. .............. 361/699 |
| 6,665,185 | B1 | * | 12/2003 | Kulik et al. ................ 361/699 |
| 2005/0128706 | A1 | * | 6/2005 | Maly et al. ................. 361/699 |

OTHER PUBLICATIONS

European Search Report dated Nov. 30, 2005.

* cited by examiner

*Primary Examiner*—Michael Datskovsky
*Assistant Examiner*—Robert J. Hoffberg
(74) *Attorney, Agent, or Firm*—Jimmy L. Funke

(57) ABSTRACT

The present invention provides a method for producing an electronic assembly and an electronic assembly with an integrated cooling system for dissipating heat. The electronic assembly comprises a base; and at least one electrical component attached to the base. The base defines an integrated cooling system having a fluid channel spanning within the base and at least one heat exchanger in heat communication with the fluid channel. The integrated cooling system may further include a pump attached to the base for directing the flow of the fluid within the fluid channel, and a port in fluid communication with the fluid channel for receiving fluid from an external source.

31 Claims, 8 Drawing Sheets

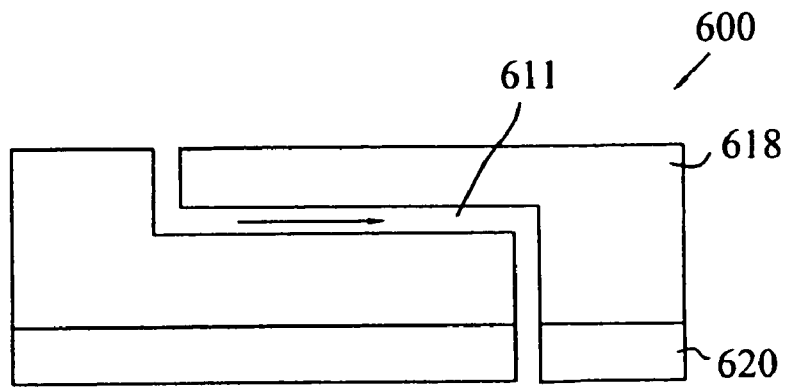
FIG. 14
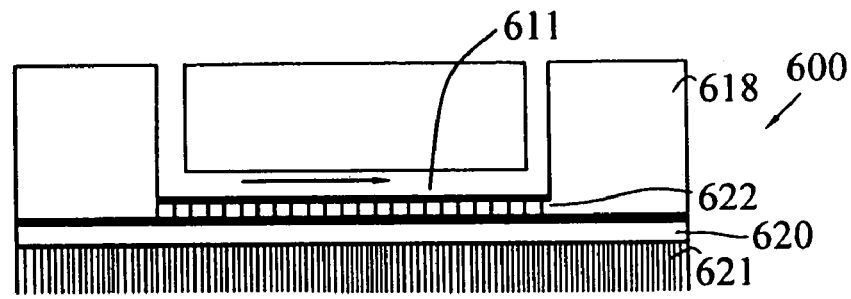
FIG. 15
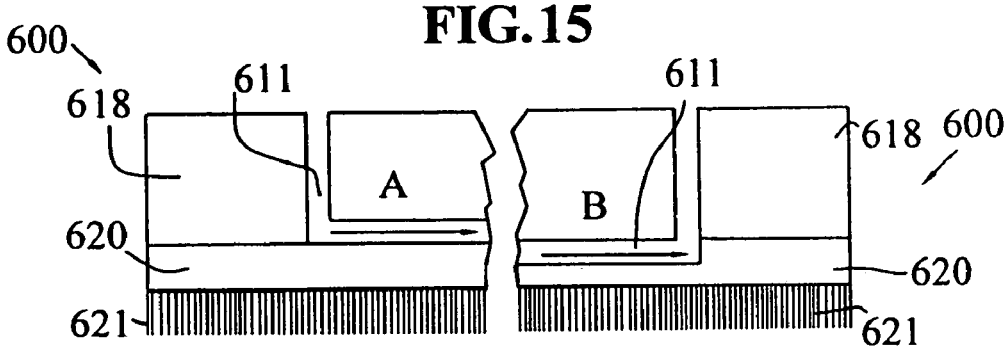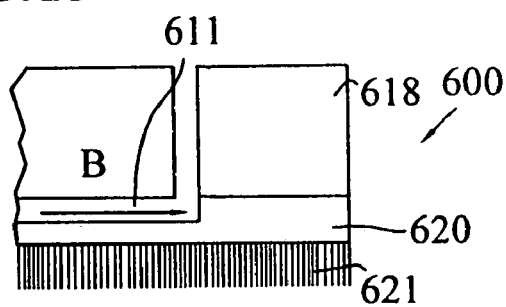
FIG. 16    FIG. 17
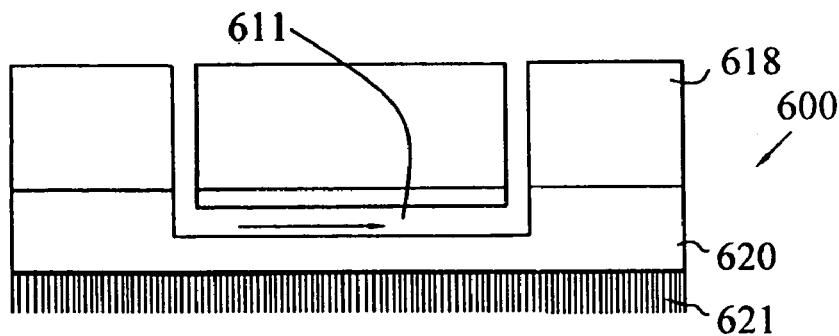
FIG. 18

INTEGRATED COOLING SYSTEM FOR ELECTRONIC DEVICES

TECHNICAL BACKGROUND

1. Field of the Invention

The present invention relates to electronic devices, particularly methods for integrating fluid cooling systems on electronic devices.

2. Description of the Related Art

Electronic components and assemblies can generate large amounts of waste heat during operation. If this heat cannot be efficiently removed the temperatures of the electronic components and assemblies can rise to levels that prevent their normal function and can also cause failure. This issue is particularly severe for electronic applications that dissipate high levels of waste heat or operate in high temperature ambient conditions.

Current solutions may involve removing heat by using one of four heat removal mechanisms or a combination of the four mechanisms. These mechanisms include conduction, convection, radiation, and evaporation.

Conduction is the property of materials to conduct heat energy from hot to colder locations. This is a low cost and reliable method of heat removal. However, the amount of heat that can be removed is limited by the intrinsic thermal conductivity of the materials used and the amount of area in the material available to remove the heat. These limitations become even more important when the size of the component and assembly becomes smaller and as the density of heat generated at both the component and assembly level increases.

Radiation is the property of materials to radiate heat energy from hot to colder environments. The efficiency of radiation for heat removal is dependent on a number of variables. The most important of these is the difference in temperature between the hot surface and cold environment. In many electronic applications, this temperature difference is too low to allow for efficient transfer of heat energy away from the heat generating components.

Evaporation of fluids to vapor (gaseous phase) can be a very efficient method of heat removal. As a fluid evaporates, heat energy is required to transform the fluid into a vapor. The required heat energy is known as the latent heat of vaporization. This property has been used in devices such as heat pipes, thermosyphons, and refrigeration systems. The biggest issue with all of these systems is the need for the containment of the vaporized fluid over the life of the product. Heat pipes and thermosyphons may also require proper orientation with respect to gravity for proper operation. This can result in high packaging cost of these systems. Because most of these cooling concepts use relatively small amounts of fluid, in high heat applications "dry out" may happen when all of the fluid available is vaporized. When this happens, the system is no longer capable of removing heat from the electronic component or assembly, potentially causing system failure.

Convection is the property of heat transfer through moving fluids (liquids and gases) to remove heat from surfaces. The heat is absorbed in the fluid by the specific heat property of the fluid and is carried away from the hot surface as the fluid moves away. In some liquid cooling systems heat can be absorbed by the formation of small vapor bubbles in the fluid caused by partial liquid boiling. This effect can improve the capability of the liquid to absorb heat energy. These small bubbles are condensed back into liquid when the fluid is cooled. Convection is the most efficient method for heat removal and is used in a number of electronic applications where removal of large amounts of heat energy or high heat density are issues. The convective cooling can be implemented by open loop or close-loop approach. In the open loop approach, the moving fluid flows through the hot device and is discarded and replaced with fresh cooler fluid. In the close-loop approach, the coolant flow through the hot surface is passed through a "heat exchanger" which cools the fluid and then re-circulated back to the hot surface to be heated again. The most common example of open loop cooling is the forced or natural convection air-cooling. However, due to low specific heat properties of gases when large amounts of heat or high heat densities are an issue, liquid cooling is much more capable of meeting the cooling requirements.

Conventional re-circulating fluid cooling systems are composed of four major parts. The first is the heat sink used to remove the heat energy from the electronic component or assembly. The second part is a heat exchanger used to cool the fluid and transport this heat into the environment. The third part is a pump used to force the fluid to circulate through the cooling system. The fourth are the channels or plumbing used to transport the fluid though the cooling system.

All of these parts of the cooling system must be constructed to contain the fluid in the system for the life of the product. Conventional systems are composed of individual components that are assembled using various joining techniques where the interfaces between the components must be fluid tight. The fabrication and assembly of these individual components can be costly and relatively complicated. In addition, the interfaces between the various components are subject to leaking which will cause failure of the cooling system. These cost, assembly and reliability issues are addressed by the following invention.

SUMMARY OF THE INVENTION

In one aspect of the present invention, a method for producing an integrated electronic assembly is provided. The method comprises the steps of: (a) fabricating a base defining an integrated cooling system for dissipating heat; and (b) attaching at least one electrical component on the base and in thermal contact with the cooling system.

Step (a) may involve fabricating interconnected channels in the base to form the fluid channel for receiving and communicating a cooling fluid.

Step (a) may further include positioning a first heat exchanger in heat communication between the electrical component and the fluid channel; and positioning a second heat exchanger in heat communication between the fluid channel and the external environment.

The method of the present invention may include attaching a pump to the base for directing a flow of the fluid. A cap may be provided over the electrical component forming a cap space in communication with the fluid channel.

The fabrication of the first and the second heat exchangers may involve creating of thermal vias within the base using a thermally conductive material such as silver, gold, tungsten, molybdenum or copper.

The method of the present invention may include the step of providing a housing body enclosing the base and the electrical component. Interconnected channels may be formed within the housing body for communicating the cooling fluid from the fluid channel in the base. The interconnected channels may extend through the housing body for communicating fluid to an external cooling component.

In another aspect of the present invention, an electronic assembly prepared by the method of the present invention is provided. The electronic assembly has an integrated re-circulating fluid cooling system that has many or all of the components integrated as part of the electronic assembly. At least one cooling system component is sealed on or within the base. The electronic assembly may include a laminated printed circuit board or a high temperature co-fired ceramic (HTCC) or low temperature co-fired ceramic (LTCC) modules, and an electrical component attached thereto.

The integrated cooling system may include a fluid channel for receiving and communicating cooling fluid within the base and at least one heat exchanger in thermal contact with the fluid channel. The at least one heat exchanger may include a first heat exchanger in thermal contact with the electrical component for transferring heat from the electrical component to the fluid within the fluid channel, and a second heat exchanger for transferring heat from the fluid within the fluid channel to be disposed externally. The electronic assembly may further include a pump for driving the flow of the fluid along the fluid channel.

The base may define a conductive layer disposed between the electrical component and the base for enhancing heat transfer from the electrical component.

In an exemplary embodiment, the electronic assembly may include a cap enclosing the electrical component on the base. The cap may define a cap space in fluid communication with the fluid channel.

The electrical component may define micro-channels for communicating the fluid therethrough. The micro-channels may be disposed relative to the top surface of the electrical component, in the middle of the electrical component, or relative to the bottom surface of the electrical component. Alternatively, the micro-channels may be disposed at the top surface, in the middle, or at the bottom surface of the conductive layer below the electrical component.

The first heat exchanger may define a plurality of thermal vias disposed within the substrate layer or the base. The second heat exchanger may define a plurality of thermal vias for heat transfer from the fluid to be disposed externally of the structure. The thermal vias may be lined or constructed with a metal such as copper.

In another exemplary embodiment, the integrated cooling system may be connected to at least one external cooling component. The external cooling component may include a pump, a heat exchanger, or a combination thereof.

In one form of the present invention, the electronic assembly may include a housing body for enclosing the base and the electronic component. The housing body may define a fluid channel and/or convection fins projecting outwardly from the housing body for dissipating heat through the housing body into the external environment.

The integrated cooling system may further comprise at least one port for introducing the cooling fluid from a fluid source to the fluid channel.

BRIEF DESCRIPTION OF THE DRAWINGS

The above-mentioned and other features and advantages of this invention, and the manner of attaining them, will become more apparent and the invention itself will be better understood by reference to the following description of embodiments of the invention taken in conjunction with the accompanying drawings, wherein:

FIG. 14 is a partial side view of an electrical assembly according to exemplary embodiment of the present invention;

FIG. 15 is a partial side view of an electrical assembly according to another exemplary embodiment of the present invention;

FIG. 16 is a partial plan side view of an electrical assembly according to another exemplary embodiment of the present invention;

FIG. 17 is a partial side view of an electrical assembly according to an alternative embodiment of the present invention;

FIG. 18 is a partial side view of an electrical assembly according to another embodiment of the present invention;

Figure 1:
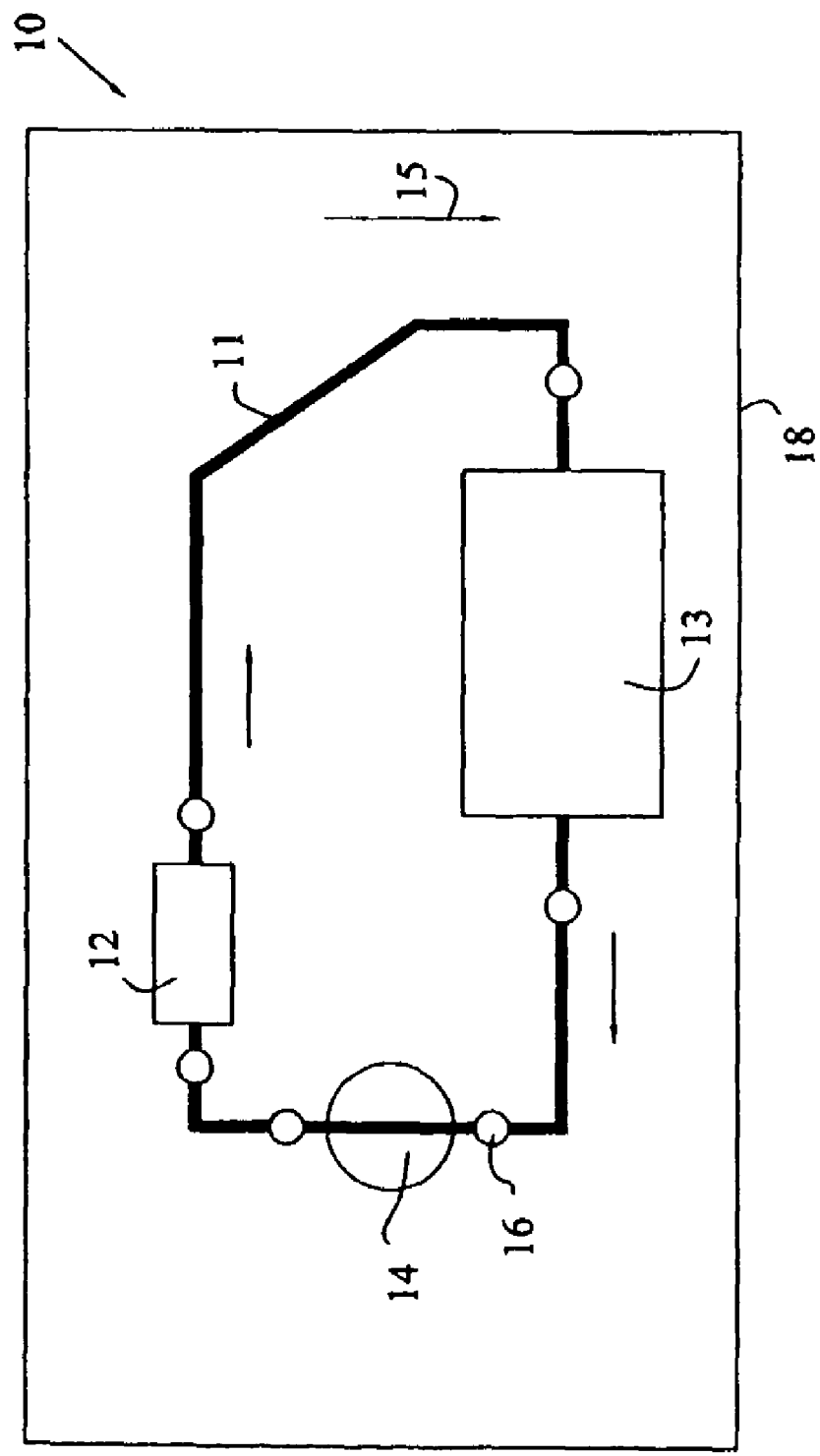
FIG. 1 is a diagram of an electrical assembly of the present invention.

Corresponding reference characters indicate corresponding parts throughout the several views. Although the drawings represent embodiments of the present invention, the drawings are not necessarily to scale and certain features may be exaggerated in order to better illustrate and explain the present invention. The exemplification set out herein illustrates an embodiment of the invention, in one form, and such exemplifications are not to be construed as limiting the scope of the invention in any manner.

DETAILED DESCRIPTION OF THE INVENTION

The present invention provides an integrated electronic cooling system having one or more cooling system components integrated on or within a base or substrate layer(s) during the assembly of the electronic device.

Referring now to FIG. 1, a system diagram of cooling system 10 of the present invention is illustrated. Cooling system 10 includes cooling system components interconnecting to one another. These components include fluid channel 11 for communicating a cooling fluid, first heat exchanger 12 for transferring heat from a heat generating source to the cooling fluid, second heat exchanger 13 for transferring heat from the hot fluid outside the electronic assembly. As shown, pump 14 is provided to direct the flow of the cooling fluid in the direction indicated by arrow 15 from first heat exchanger 12 to second heat exchanger 13 and re-circulate back to pump 14 and first heat exchanger 12. Also shown is a plurality of ports 16 connected to fluid channel 11 for receiving fluid from an external source. Each of the cooling system components may be integrated within cooling system 10 during the assembly of cooling system 10 by fabricating within base 18 or attaching to base 18 by an attachment layer of a suitable material, to be further described hereinbelow.

Base 18 may be fabricated using any suitable material and method generally known in the art for particular electronic devices. For example, base 18 of a Printed Circuit Board (PCB) may be fabricated with a single or multiple layers of varying materials, which may include a board made of paper phenolic or glass fiber epoxy, copper layers, component layers and masking layers. Base 18 of other electronic assemblies may define multiple layers of substrate (see FIGS. 2–3) such as low temperature co-fired ceramics (LTCC) or high-temperature co-fired ceramics (HTCC). During the assembling process, the passive elements, such as resistors, capacitors and inductors may be embedded within the ceramic layers to form a ceramic interconnect module.

Figure 2:
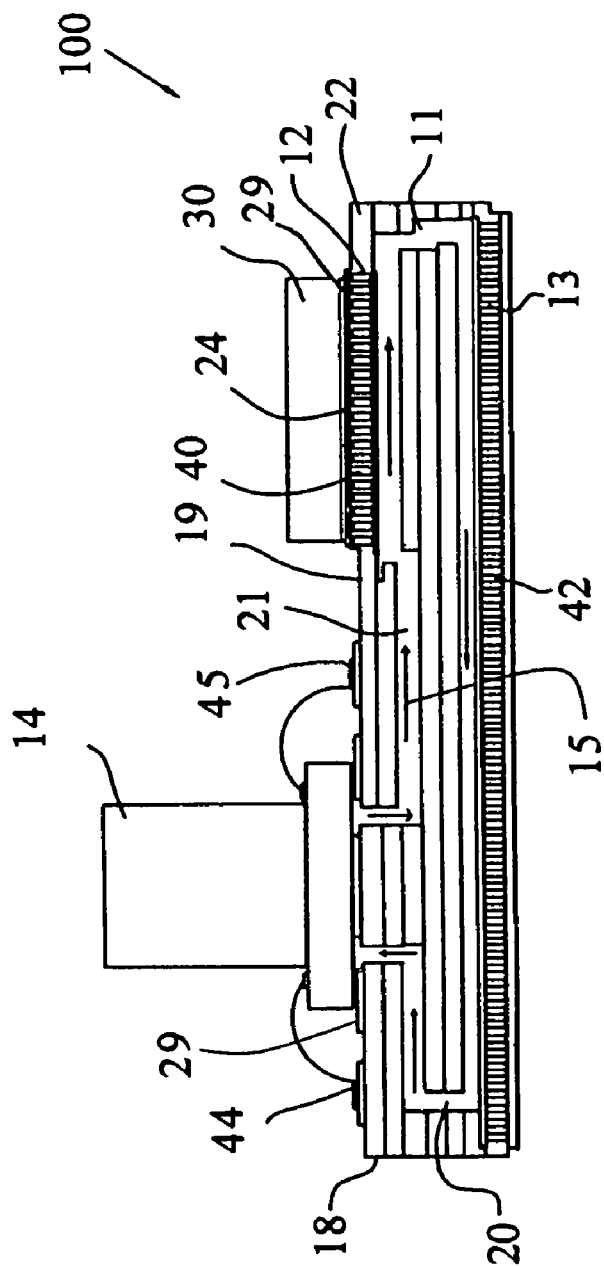
FIG. 2 is a side view of an electrical assembly according to one embodiment of the present invention.
Figure 3:
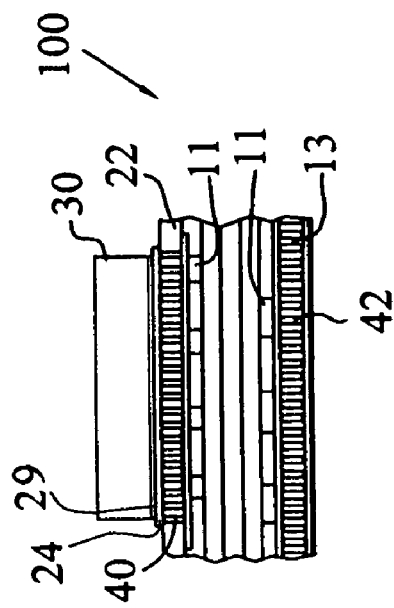
FIG. 3 is an end view of the electrical assembly according to the embodiment shown in FIG. 2.

As shown in FIGS. 2–3, electronic assembly 100 includes electrical component 30 surface mounted on base 18. Electrical component 30 may include a chip, a die, a power device, or any combination thereof, having electrical circuits connected thereto. Electrical component 30 usually generates heat that may interfere with the normal function of electrical component 30 if unabated. Heat may be dissipated from component 30 via integrated cooling system components including fluid channel 11, first heat exchanger 12, and second heat exchanger 13. Fluid channel 11 is made up of interconnected vertical channels 20 and horizontal channels 21 extending within base 18.

Vertical and horizontal channels 20–21 which defines portions of fluid channel 11, such as those shown in FIGS. 2–3, may be fabricated by cutting or etching in laminate cores or pre-preg layers or PCB board prior to PCB lamination. These channels may be coated with a layer of material that is impermeable to the fluid. This layer is made by conventional plating or lamination techniques normally used in PCB.

Similarly in LTCC or HTCC base, vertical and horizontal channels 20–21 of fluid channel 11 may be fabricated by punching through layers of the substrate, or forming void patterns prior to stacking the layers. After that, all layers are laminated and co-fired at appropriate temperatures to create a highly compact ceramic structure. The channels may also be coated with a fluid-impermeable material prior to or after firing.

As shown in FIGS. 2–3, first heat exchanger 12 is disposed within top layer 22 of base 18 or under electrical component 30. First heat exchanger 12 defines a plurality of thermal vias 40 for conducting heat from the electrical component 30 to the cooling fluid flowing within fluid channel 11 (see arrow 15). Second heat exchanger 13 is disposed relatively to the bottom of base 18. Second heat exchanger 13 defines a plurality of thermal vias 42 for transferring heat from fluid in fluid channel 11 to be disposed externally of base 18.

First heat exchanger 12 and/or second heat exchanger 13 may be manufactured on the PCB or HTCC or LTCC substrate and sealed with attached components such as the electronic component 30, as shown in FIGS. 2–3. Alternately, first heat exchanger 12 and/or second heat exchanger 13 may be entirely contained within base 18. A surface conductive or metal layer such as conductive layer 24 (see FIGS. 2–3) may be used to seal the exchanger within the base. Thermal vias 40 and 42 of the first and second heat exchangers 12 and 13 may be fabricated by etching or punching through a portion of the base material or the substrate similar to what is described above for the fabrication of the fluid channel. Conductive metal layers may be formed above and below the vias to enhance heat transfer to and from the heat exchangers. Thermal vias 40 and 42 may be filled with a thermally conductive material. An add-on or external heat exchanger may also be considered as an alternative or additional option.

Referring again to FIG. 2, pump 14 is attached to top surface, 19 of base 18 with attachment layer 29 which may be solder or electrically conductive polymer or any other similar attachment material. Pump 14 is connected to electrical inlet 44 and electrical outlet 45 that communicate with an external electrical source for providing power to pump 14. Pump 14 is operationally coupled with fluid channel 11. When pump 14 is operating, cool fluid in fluid channel 11 is forced to circulate in the direction toward first heat exchanger 12 (see arrow 15) for cooling electrical component 30. Heat from electrical component 30 is transferred through thermal vias 40 of first heat exchanger 12 to heat the fluid within fluid channel 11. Then, the hot fluid is forced to move toward second heat exchanger 13. The heat from the hot fluid is transferred through second heat exchanger 13 and released externally. As a result, the fluid that moves passing second heat exchanger 13 becomes cool. The cool fluid is then forced back to pump 14 to complete a cooling cycle.

The pump according to the present invention can be incorporated onto the PCB. By attaching the pump to the base by soldering where the solder joints provide both electrical and sealed plumbing connections. In this case, the pump chamber may be formed by a combination of a base cavity and the pump body, or the pump may be self-contained with only ports for fluid inlet and outlet.

Figure 4:
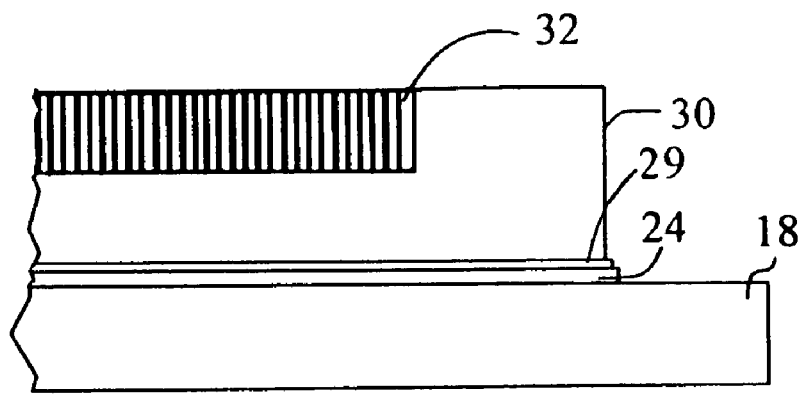
FIG. 4 is a partial side view of an electrical assembly according to another embodiment of the present invention.
Figure 5:
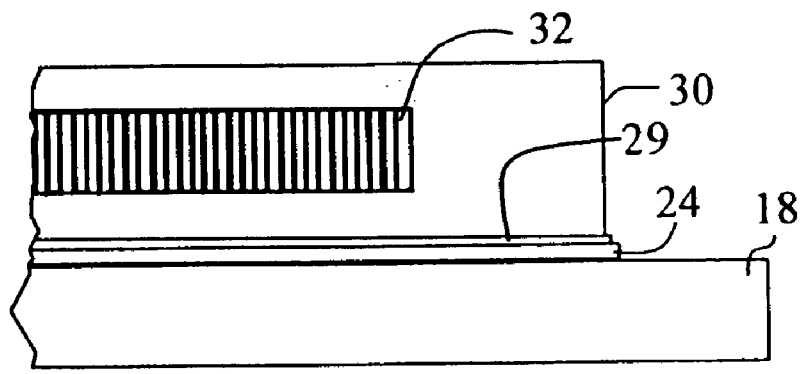
FIG. 5 is a partial side view of an electrical assembly according to another embodiment of the present invention.
Figure 6:
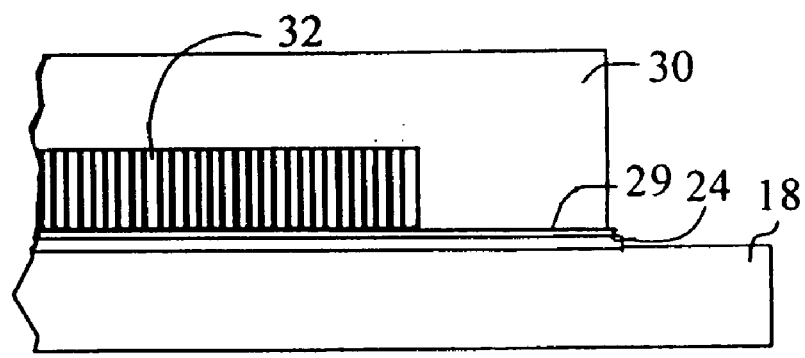
FIG. 6 is a partial side view of an electrical assembly according to alternate embodiments of the present invention.
Figure 7:
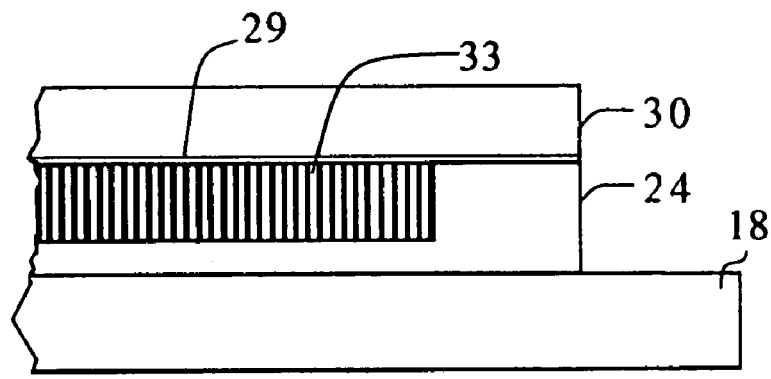
FIG. 7 is a partial side view of an electrical assembly according to another embodiment of the present invention.
Figure 8:
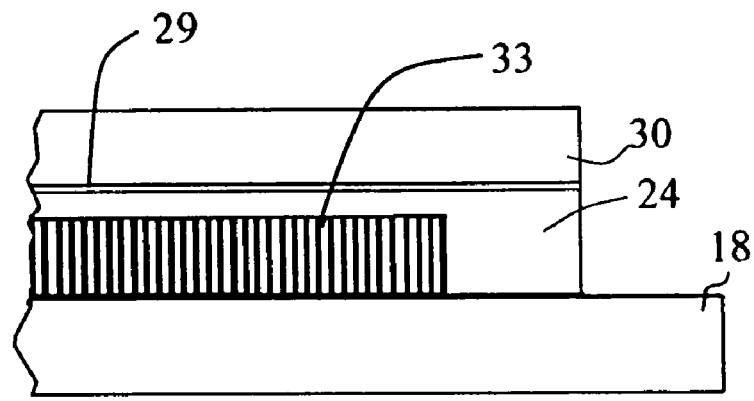
FIG. 8 is a partial side view of an electrical assembly according to another embodiment of the present invention.

In FIGS. 4–9, partial side views of alternative embodiments are demonstrated. In these embodiments, fluid micro-channels 32 or 33 are fabricated in alternative positions within electrical component 30 or within conductive layer 24 underlying electrical component 30. As shown in FIGS. 4–6, fluid micro-channels 32 are disposed at the top portion, in the middle portion, and in the bottom portion of electrical component 30, respectively. As shown in FIGS. 7–8, fluid micro-channels 33 are fabricated within the top portion, and in the bottom portion of thermally conductive layer 24, respectively. It is contemplated that fluid micro-channels 32–33 are in fluid communication with the fluid channel 11 in base 18 (see FIGS. 2–3) such that the cooling fluid flows from fluid channel 11 through fluid micro-channels 32 and/or 33 to cool the electrical component 30 and back to fluid channel 11 Device 30 is electrically attached to thermally conductive layer 24 via attachment layer 29 which may be solder or electrically conductive polymer or similar material (See FIGS. 4–9).

Figure 9:
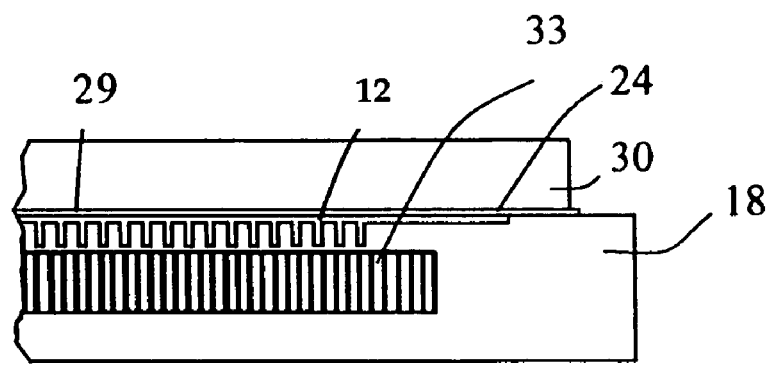
FIG. 9 is a partial side view of an electrical assembly according to another embodiment of the present invention.

In FIG. 9, micro-channels 33 are disposed completely within base 18. Further provided is first heat exchanger 12 in thermal communication between electrical component 30 and micro-channels 33.

Figure 10:
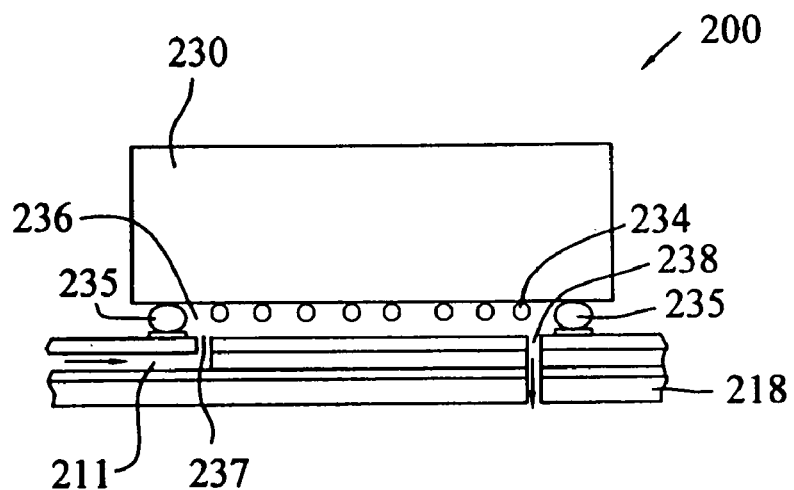
FIG. 10 is a side view of an electrical assembly according to another embodiment of the present invention.
Figure 11:
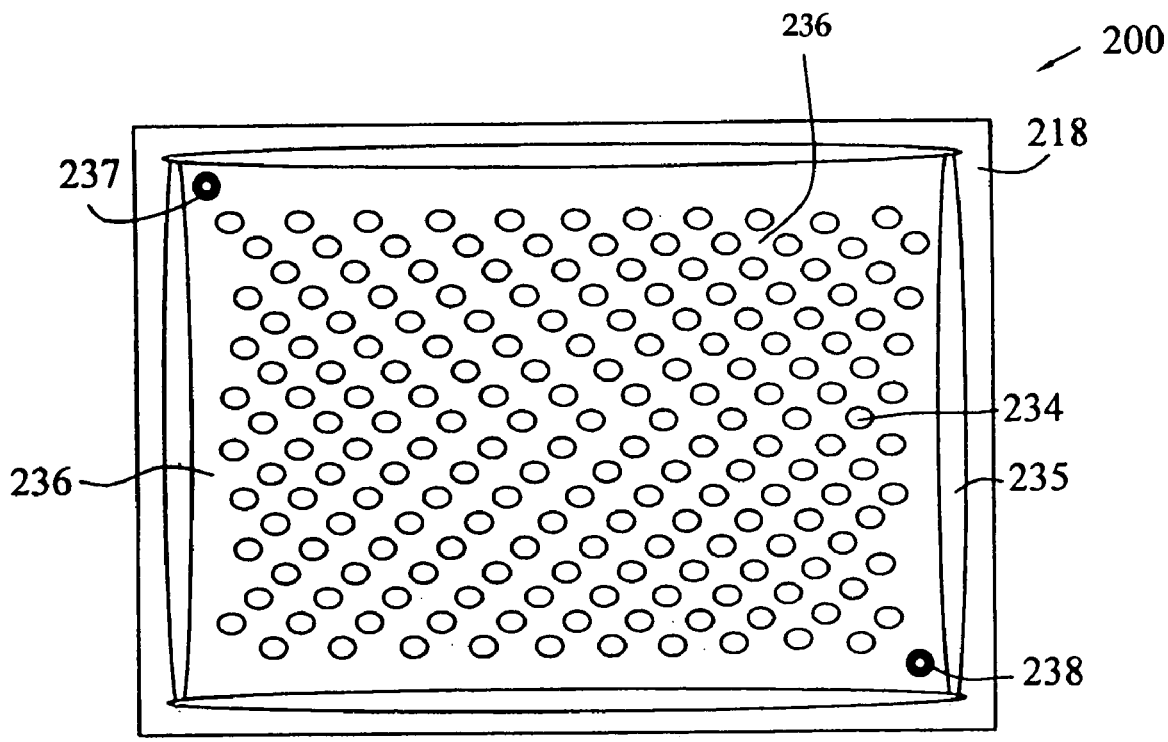
FIG. 11 is a top view of a base of the electrical assembly according to the embodiment shown in FIG. 10.

In another exemplary embodiment of the present invention, as shown in FIGS. 10–11, electrical assembly 200 comprises base 218 of a PCB and an electrical component 230 in the form of a flip chip, or another device, that is surface mounted and sealed on base 218 using solder seal 235, or any other sealant material or a combination thereof as known in the art. Metal or solder bumps 234 are provided for conducting electrical signals therethrough. Bumps 234 form a network of interconnecting space 236 between base 218 and electrical component 230. Interconnecting space 236 is in fluid communication with fluid channel 211 provided within base 218 through inlet 237 and outlet 238. A pump, a first heat exchanger, and a second heat exchanger may be provided as above-described (see FIGS. 2–3). The pump may direct a cooling fluid to flow through fluid channel 211 (see arrow) into interconnecting space 236 for cooling electrical component 230. Hot fluid from interconnecting space 236 moves through outlet 238 to be coupled with a heat exchanger disposed distantly (not shown).

Figure 12:
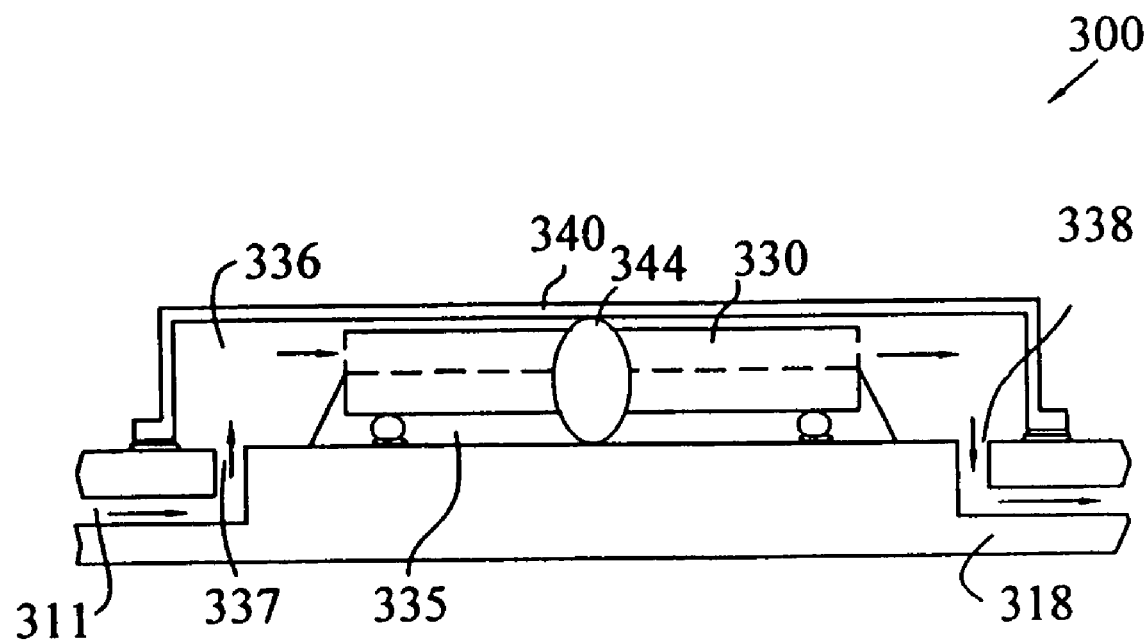
FIG. 12 is a side view of an electrical assembly according to another embodiment of the present invention, the assembly having a cap.
Figure 13:
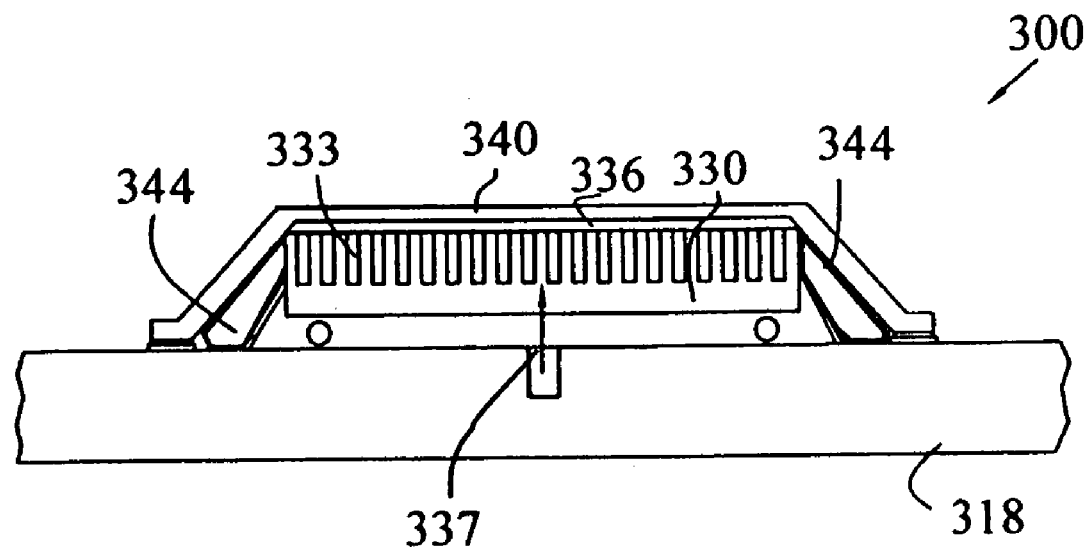
FIG. 13 is an end view of the electrical assembly according to the embodiment shown in FIG. 12.

In another exemplary embodiment, as shown in FIGS. 12–13, electrical assembly 300 comprises base 318, which may be a PCB, ceramic or other substrate, and electrical component 330 in the form of a flip chip that is surface mounted and sealed with sealant 335 on base 318. In addition, cap 340 is provided over electrical component 330 such that electrical component 330 is sealed within space 336 under cap 340. As shown, base 318 defines fluid channel 311 in communication with space 336 through inlet 337 and outlet 338. In addition, electrical component 330 may define fluid micro-channels 333 in fluid communication with space 336. Also shield 344 is placed between electrical component 330 and cap 340 in space 336 such that all fluid is required to flow through channels 333 and not bypass electrical component in space 336. Similar to what described above, a pump, a first heat exchanger, and a second heat exchanger may be provided and disposed distantly on base 318. The pump may direct a cooling fluid to flow through fluid channel 311 (see arrows) through inlet 337 into space 336 and micro-channels 333 for cooling electrical component 330. Hot fluid from space 336 moves out of space 336 through outlet 338 to be coupled with a heat exchanger (not shown).

Shown in FIGS. 14–18 are partially drawn side views of the electronic assembly according to alternative embodiments. As shown in FIG. 14, electronic assembly 600 includes housing body 620 enclosing base 618. Other cooling system components (not shown) may be laid out as above described. In addition, fluid channel 611 defined in base 618 extends through housing body 620 to be communicate to an external heat exchanger (not shown) disposed outside housing body 620. Hot fluid flows through fluid channel 611 in the direction demonstrated by the arrow. The heat from the fluid may be dissipated via the external heat exchanger.

Alternatively, as shown in FIGS. 15–18, an additional heat exchanger may be provided in the form of convection fins 621 disposed on the outer surface of housing body 620. In FIG. 15, heat exchanger 622 is also provided in the form of thermal vias, coupling fluid channel 611 in base 618. Heat in the hot fluid flowing within fluid channel 611 (see arrow) may be transferred through heat exchanger 622 to convection fins 621 to be released outside housing body 620.

FIGS. 16–17 demonstrate two options for the positioning of fluid channel 611 at the interface of base 618 and housing body 620. In option A (FIG. 16), fluid channel 611 is formed from a recess defined on the bottom surface of base 618, and in option B (FIG. 17), fluid channel 611 is formed from a recess defined on the top surface of housing body 620. Heat from the hot fluid in fluid channel 611 is dissipated outside housing body 62Q through convection fins 621.

In FIG. 18 fluid channel 611 extends vertically through base 618 and is horizontally imbedded in housing body 620.

Figure 19:
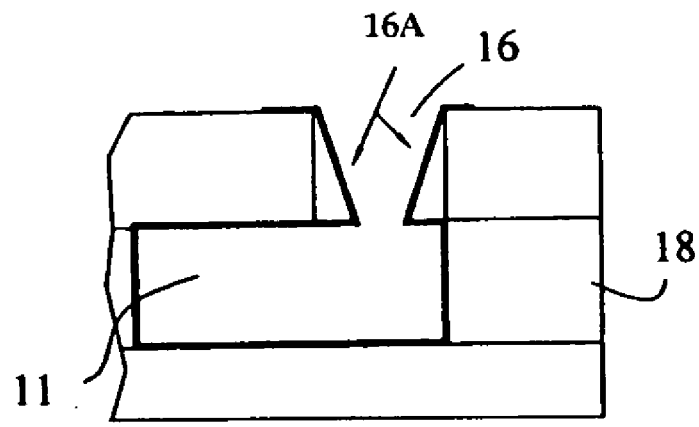
FIG. 19 is a side view of a port according to one embodiment of the invention.
Figure 20:
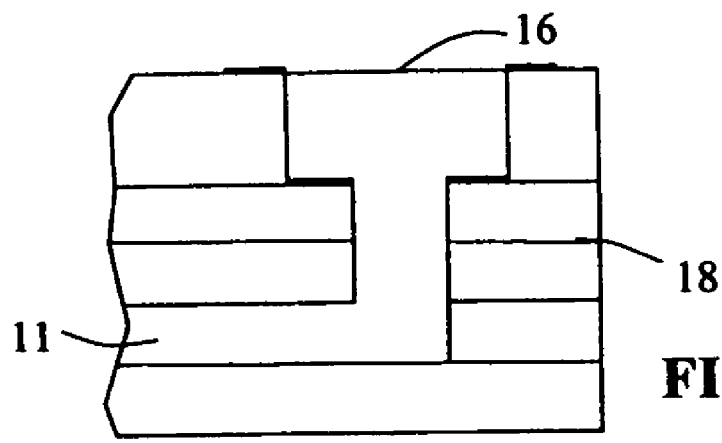
FIG. 20 is a side view of a port according to another embodiment of the invention.
Figure 21:
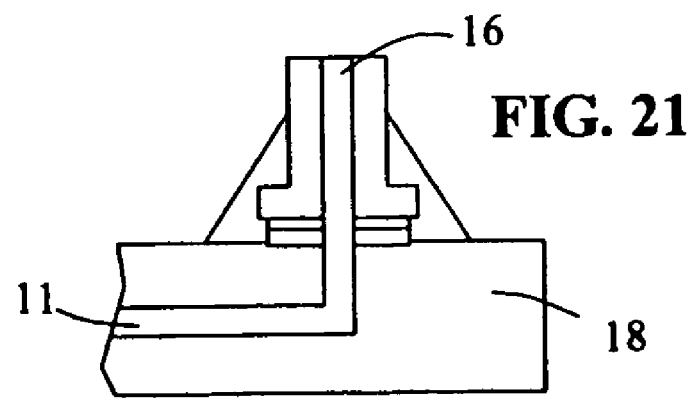
FIG. 21 is a side view of a port according to another embodiment of the invention.

As demonstrated in FIGS. 19–21, ports for receiving cooling fluid into the integrated cooling system may vary in shape and size. In FIGS. 19–20, port 16 is formed by etching or machining through a plurality of layers of the substrate or base 18 and connected to fluid channel 11. Like fluid channel 11, port 16 should be lined or sealed with hygroscopic material impervious to the fluid to prevent fluid leakage. Port 16 may be lined or sealed using metal solder or any other sealant known in the art. As shown, port 16 is lined with layer 16A which may be made of copper.

In FIG. 21, port 16 is attached to base 18 using metal solder or/and mechanical strength adhesive. Port 16 extends from the surface of base 18, and is in communication with fluid channel 11 running within base 18.

While the present invention has been described as having exemplary embodiments, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A method for producing an electronic assembly with an integrated cooling system comprising the steps of:
   (a) fabricating a base defining an integrated cooling system comprising a fluid channel for receiving a cooling fluid; and
   (b) attaching at least one electrical component on the base;
   (c) fabricating a plurality of micro-channels within the at least one electrical component; and
   (d) attaching a cap to the base over the at least one electrical component to provide a cap space in fluid communication with the fluid channel for receiving and retaining the cooling fluid, the plurality of micro-channels being in fluid communication with the cap space;
   whereby heat generated from the at least one electrical component is transferable to the cooling fluid to be dissipated.

2. The method of claim 1, wherein step (a) comprises more than one of the steps of:
   (e) fabricating interconnected channels in the base to form the fluid channel for receiving and communicating the cooling fluid;
   (f) fabricating a first heat exchanger relative to the at least one electrical component for transferring heat from the at least one electrical component to the cooling fluid;
   (g) fabricating a second heat exchanger relative to an outer surface of the base for transferring heat from the cooling fluid to an external environment;
   (h) attaching a pump on the base for directing a flow of fluid within the fluid channel;
   (i) fabricating at least one port on the base for receiving the cooling fluid into the fluid channel, the at least one port being in fluid communication with the fluid channel; and (j) fabricating a thermally conductive layer between the at least one electrical component and the base for conducting heat from the at least one electrical component toward the base.

3. The method of claim 2, wherein at least one of steps (f) and (g) comprises the step of fabricating a plurality of thermal vias on a surface of the base.

4. The method of claim 3, wherein the step of fabricating the plurality of thermal vias includes filling the thermal vias with a thermally conductive material.

5. The method of claim 2 further comprising the step of enclosing the base and the electrical component with a housing body.

6. The method of claim 5 wherein step (e) further comprises the step of fabricating a plurality of interconnected channels in the housing body in fluid communication with the fluid channel in the base.

7. The method of claim 6, wherein the housing body defines convection fins projecting outwardly from an outer surface of the housing body for transferring heat outside the housing body.

8. The method of claim 7, wherein the plurality of the interconnected channels in the housing body is in communication with at least one of: an external pump, and an external heat exchanger.

9. The method of claim 2 wherein step (i) includes coating the at least one port with a material impervious to fluid.

10. An electronic assembly produced by the method of claim 1.

11. An electronic assembly comprising:
a base; and
a fluid channel spanning within the base for receiving and transporting a cooling fluid therein;
at least one electrical component attached to the base, the base defining an integrated cooling system in thermal communication with the at least one electrical component for dissipating heat from the at least one electrical component;
a cap sealed on the base and enclosing the at least one electrical component on the base, the cap defining a cap space surrounding the at least one electrical component and in fluid communication with the fluid channel for receiving and retaining cooling fluid;
wherein the electrical component includes a plurality of micro-channels in fluid communication with the cap space.

12. The electronic assembly of claim 11, wherein the integrated cooling system comprises:
at least one heat exchanger sealed within the base and in thermal contact with the fluid channel for dissipating heat.

13. The electronic assembly of claim 12, wherein the at least one heat exchanger comprises:
a first heat exchanger integrated within the base and in thermal contact with the at least one of electrical component, the first heat exchanger transferring heat from the at least one of electrical component to the cooling fluid; and
a second heat exchanger integrated within the base and in heat communication with the fluid channel for transferring heat from the fluid to be disposed externally.

14. The electronic assembly of claim 13, wherein the first heat exchanger defines a plurality of thermal vias disposed within the base and in heat communication with the fluid channel.

15. The electronic assembly of claim 14, wherein the plurality of thermal vias is filled with a thermally conductive material.

16. The electronic assembly of claim 14, wherein the plurality of thermal vias is filled with at least one of: silver, gold, tungsten, molybdenum, and copper.

17. The electronic assembly of claim 13, wherein the second heat exchanger defines a plurality of thermal vias disposed within the base and in heat communication with the fluid channel.

18. The electronic assembly of claim 17, wherein the plurality of thermal vias is coated with a thermally conductive material layer.

19. The electronic assembly of claim 17, wherein the plurality of thermal vias is coated with at least one of: silver, gold, tungsten, molybdenum, and copper.

20. The electronic assembly of claim 12 further comprises:
a pump attached on the base and operably connected to the fluid channel for driving a flow of the fluid.

21. The electronic assembly of claim 12 wherein the integrated cooling system further comprises:
a thermally conductive layer disposed between the at least one electrical component and the base for transferring heat from the at least one electrical component to the base, the thermally conductive layer enclosed within the cap space.

22. The electronic assembly of claim 21, wherein the integrated cooling system further includes a plurality of micro-channels defined within the thermally conductive layer, and in fluid communication with the fluid channel.

23. The electronic assembly of claim 12 further comprising a housing for enclosing the base and the at least one electrical component.

24. The electronic assembly of claim 23, wherein the housing includes a housing body having convection fins projecting outwardly from an outer surface of the housing body for dissipating heat externally of the housing.

25. The electronic assembly of claim 24 wherein the at least one heat exchanger includes a plurality of thermal vias in heat communication between the fluid channel and the housing body.

26. The electronic assembly of claim 24, wherein the fluid channel extends within the housing body.

27. The electronic assembly of claim 26, wherein the fluid channel extends though the housing body and is adapted to be in thermal contact with an external heat exchanger.

28. The electronic assembly of claim 12, wherein the cooling system further comprises at least one port for introducing the fluid from a fluid source to the integrated cooling system, the at least one port is in fluid communication with the fluid channel.

29. The integrated electronic assembly of claim 11, wherein the base is adapted to form at least one of: a laminated printed circuit board (PCB), a high-temperature co-fired ceramic (HTCC) module, and a low temperature co-fired ceramic (LTCC) module.

30. The electronic assembly of claim 11, wherein the base defines at least one substrate layer disposed below the at least one electrical component.

31. The electronic assembly of claim 11, wherein the integrated cooling system is adapted to connect to at least one external cooling component.

* * * * *